(12) United States Patent
Takahashi et al.

(10) Patent No.: US 6,656,609 B2
(45) Date of Patent: Dec. 2, 2003

(54) ORGANIC EL ELEMENT

(75) Inventors: Hisamitsu Takahashi, Mobara (JP); Shigeru Hieda, Mobara (JP); Yuji Saito, Mobara (JP)

(73) Assignee: Futaba Corporation, Mobara (JP)

( * ) Notice: Subject to any disclaimer, the term of this patent is extended or adjusted under 35 U.S.C. 154(b) by 0 days.

(21) Appl. No.: 09/848,319

(22) Filed: May 4, 2001

(65) Prior Publication Data

US 2002/0015818 A1 Feb. 7, 2002

(51) Int. Cl.[7] .............................................. H05B 33/04
(52) U.S. Cl. .................... 428/690; 428/76; 428/917; 313/504; 313/512; 257/100
(58) Field of Search ................................. 428/690, 917, 428/76; 313/504, 512; 257/100

(56) References Cited

U.S. PATENT DOCUMENTS 5,268,145 A * 12/1993 Namba et al. ................ 422/57
6,111,357 A * 8/2000 Fleming et al. ............. 313/509

FOREIGN PATENT DOCUMENTS

| EP | 0 114 258 A1 | * | 8/1984 |
| JP | 59-099782 | * | 6/1984 |
| JP | 60-224250 | * | 11/1985 |
| JP | 61-160981 | * | 7/1986 |
| JP | 04-249590 | * | 9/1992 |
| JP | 04-255693 | * | 9/1992 |
| JP | 2000-324407 | * | 4/2000 |
| WO | WO 94/07344 | * | 3/1994 |

* cited by examiner

*Primary Examiner*—Cynthia H. Kelly
*Assistant Examiner*—Dawn Garrett
(74) *Attorney, Agent, or Firm*—Oblon, Spivak, McClelland, Maier & Neustadt, P.C.

(57) ABSTRACT

An organic EL element maintaining emission characteristics for long periods of time comprising: a laminate having a structure such that organic EL material layers are sandwiched between a pair of opposite electrodes; a sealed container into which is placed said laminate; and a drying member which is placed in said sealed container and prevents contamination of said organic EL material layers by moisture, wherein said drying member is formed of an organometallic compound. The organometallic compound adsorbs chemically water and functions as an adhering agent for other physical drying agents and chemical drying agents and has no adverse effect on the organic EL element and can prevent growth of a dark spot.

9 Claims, 4 Drawing Sheets

ORGANIC EL ELEMENT

BACKGROUND OF THE INVENTION

The present invention relates to an organic EL element maintaining stable emission characteristics for long periods of time.

The organic EL element comprises an organic EL layer of a thin film containing a phosphor organic compound sandwiched between a pair of electrodes, a cathode and an anode. The organic EL element is a spontaneous light-emitting element in which a hole and an electron are injected into the thin film and recombined to generate an exiton and which utilizes emission of light (fluorescence/phosphorescence) when the exiton is inactivated.

The most significant problem of the above-described organic EL element is to improve its durability and, above all, generation of non-light emitting portion called "dark spot" and the prevention of its growth. When the diameter of the dark spot grows in tens of micrometers($\mu$m), the non-light emitting portion can be confirmed by visual observation. A principal cause of the dark spot is the influence of water and oxygen and particularly the water, which has been known to influence the element most seriously even in a trace amount.

It is, therefore, necessary to exclude the water from the materials constructing the EL element. It is particularly important to purify organic materials used in a light-emitting part to exclude the water. The organic EL element is produced in a dry process by contriving to exclude the water in a container under vacuum at the time of forming the film or in a process such as sealing process and the like. Currently, however, the water can not be removed completely and the generation of the dark spot can not be completely prevented.

As described above, the principal problem of the organic EL element is complete removal of the water in the container to eradicate the dark spot to lengthen life. As one of the measures, it is known that the removal of the water can be drastically improved by sealing the container of the organic EL element with a water-trapping agent as additional drying means (for example, Unexamined Patent Publication (Kokai) No. 9-148066).

Figure 4:
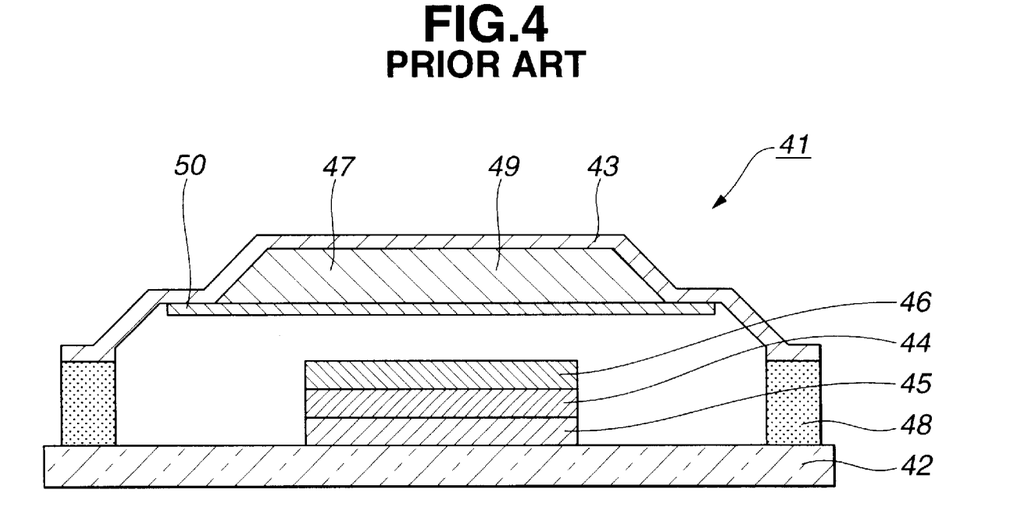
FIG. 4 is a side sectional view of a conventional organic EL element.

FIG. 4 is a side sectional view showing the structure of a conventional organic EL element using a water-trapping agent as drying means. The organic EL element 41 shown in FIG. 4 comprises an insulating and transparent glass substrate 42 on which is formed a transparent conductive film comprising ITO (Indium Tin Oxide), and forms an anode 45.

An organic EL layer 44 of a thin film of an organic compound material is formed on the anode 45. A cathode of a metal thin film of, for example Al—Li is formed on the organic EL layer 44, and a light-emitting part of a laminate comprising a the anode 45, the organic EL layer 44 and the cathode 46 is formed. The organic EL layer 44 is comprised of a hole injection layer, a hole transportation layer, an electron transportation layer, an electron injection layer, and the like including at least an organic light-emitting layer required for EL light-emission.

Around the periphery of the glass substrate 42 is fixed the metal cap 43 by adhesive 48 in an atmosphere of inert gas (for example dry nitrogen) from which water is removed completely or in a dry atmosphere by dry air. Thereby, the anode 45, the organic EL layer 44 and the cathode 46 on the glass substrate constructing the element are protected.

Inside the inner surface of the metal cap 43 is formed a recess 49 molded by press molding and the like. In the recess 49 is contained powder drying agent 47 such as barium oxide or calcium oxide as drying means. The recess 49 in which is contained the powder drying agent 47 is covered with a sheet-like water-permeable cover 50. The drying agent 47 in the recess 49 adsorbs the residual moisture in the container to form hydroxide, thereby removing the residual moisture in the container or moisture from outside.

However, in the case of the conventional organic EL element 41 as shown in FIG. 4 the drying agent 47 contained in the recess 49 of the metal cap 43 is powder. A problem is that when calcium oxide, used as the drying agent 47, adheres to the cathode 46, aluminum of the cathode and calcium oxide are chemically reacted with the water, resulting in corrosion of the thin film cathode of aluminum, and the like of the cathode 46. In order to solve the problem, it has been required that the recess 49 in which is contained the drying agent 47 is covered with the cover 50 to isolate the drying agent 47 from the light-emitting part so that the calcium oxide as the drying agent does not adhere the cathode.

Therefore, the metal cap 43 used has a special shape and the structure becomes complicated. Further, there is a problem in that a large space is required for confining the drying agent and the entire element becomes thick.

Further, there is a problem in that when the drying agent 47 is confined in the recess 49 of the metal cap 43, handling such that the organic EL element is not contaminated is difficult because the drying agent 47 is powder and workability is extremely bad.

Furthermore, there is a problem that the generation and growth of the dark spot at peripheral portion of the sealed portion of the organic EL element can not be sufficiently prevented, even if the dark spot is prevented by the drying means by the metal cap.

SUMMARY OF THE INVENTION

Therefore, the object of the present invention is to overcome the problems described above and the provision of an organic EL element capable of being made thinner equipped with a film-like drying means which can adsorb moisture effectively and in good workability to inhibit the generation and growth of the dark spot at the peripheral portion of the organic EL element.

According to the present invention, there is provided an organic EL element comprising: a laminate having a structure in which organic EL material layers are sandwiched between a pair of opposite electrodes; a sealed container into which is placed the laminate; and a drying member which is placed in the sealed container and prevents contamination of the organic EL material layer by moisture, characterised in that the drying member is formed of an organometallic compound.

Preferably, the drying member is formed of an organometallic compound illustrated by the formula (1)

wherein R is one selected from the group consisting of alkyl group, alkenyl group, aryl group, cycloalkyl group, heterocyclic group and acyl group having at least one carbon atom, M is a trivalent metal atom, and n is an integer of more than one.

Preferably, the drying member is formed of an organometallic compound illustrated by the formula (2)

wherein each of $R_1$, $R_2$, $R_3$, $R_4$ and $R_5$ is one selected from the group consisting of alkyl group, alkenyl group, aryl group, cycloalkyl group, heterocyclic group and acyl group having at least one carbon atom, and M is a trivalent metal atom.

Preferably, the drying member is formed of an organometallic compound illustrated by the formula (3)

wherein each of $R_1$, $R_2$, $R_3$ and $R_4$ is one selected from the group consisting of alkyl group, alkenyl group, aryl group, cycloalkyl group, heterocyclic group and acyl group having at least one carbon atom, and M is a tetravalent metal atom.

Preferably, the drying member of the organometallic compound is placed on an inner surface of the sealed container.

Preferably, the drying member is placed such that it acts as a protecting member covering the organic EL layers.

Optionally, the drying member of the organometallic compounds is used in combination with an inorganic drying agent.

Optionally, the drying member of the organometallic compounds is used in combination with an inorganic drying agent taking advantage of physical adsorption.

Optionally, the drying member of the organometallic compounds is used in combination with an inorganic drying agent taking advantage of chemical reaction.

Optionally, the drying member of the organometallic compounds is used in combination with the inorganic drying agent taking advantage of the chemical reaction and the inorganic drying agent taking advantage of the physical adsorption.

These and other objects and advantages of the present invention will be appreciated by those skilled in the art from the description given herein and the appended claims.

BRIEF DESCRIPTION OF THE DRAWINGS

The invention may be put into practice in various ways and a number of embodiments will be described by way of example to illustrate the invention with reference to the accompanying drawings, in which.

DETAILED DESCRIPTION OF THE PREFERRED EMBODIMENTS

Figure 1:
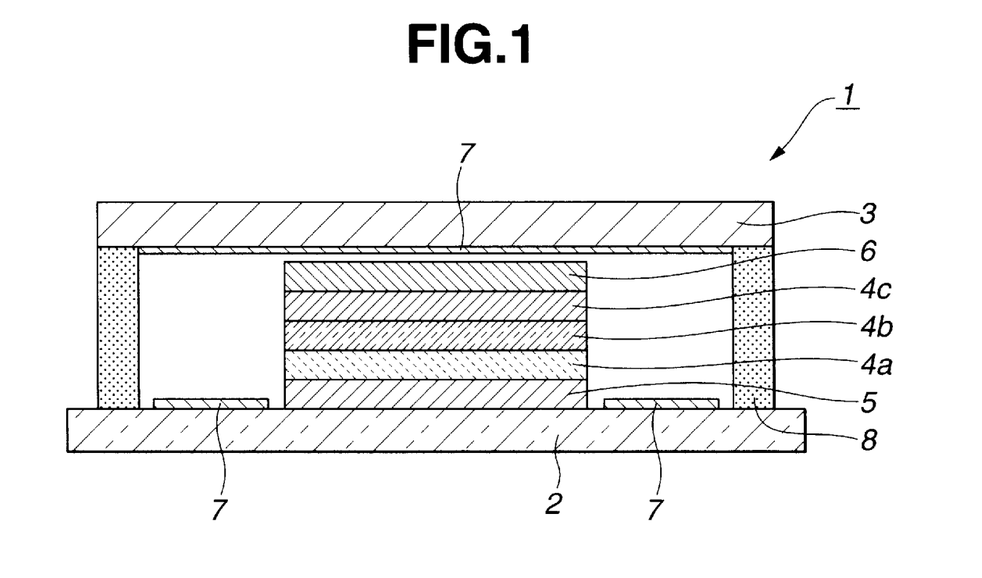
FIG. 1 is a side sectional view of a first embodiment of the present invention.
Figure 2:
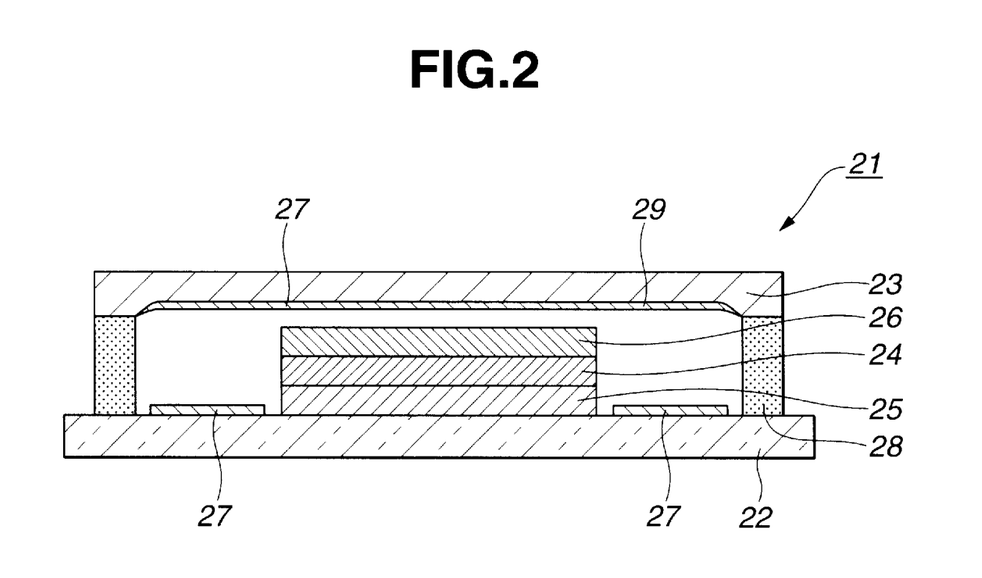
FIG. 2 is a side sectional view of a second embodiment of the present invention.
Figure 3:
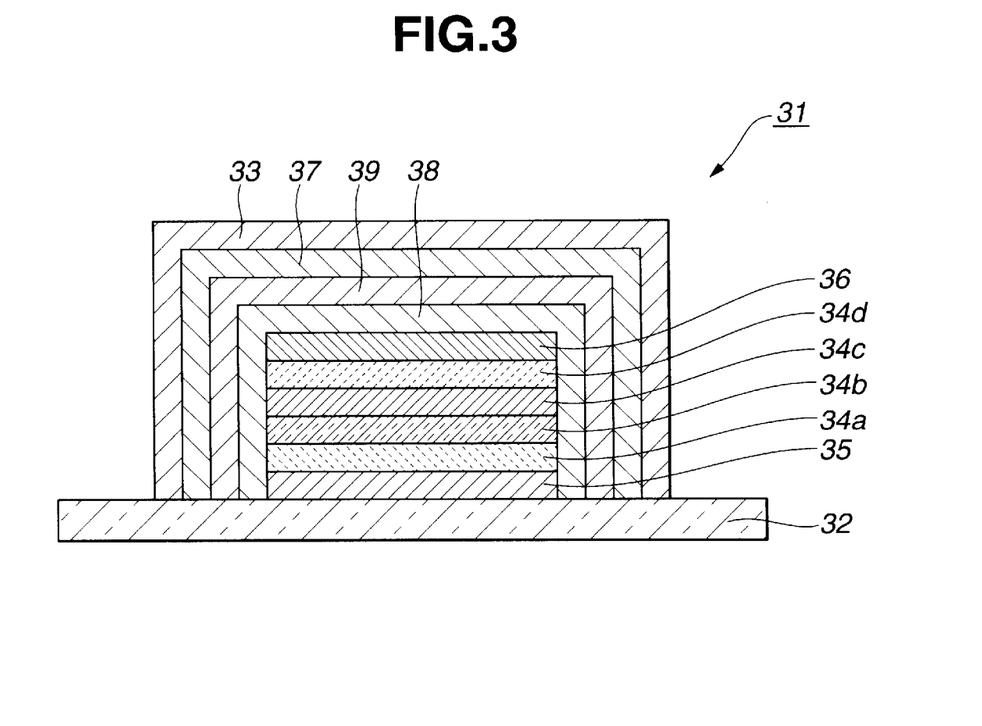
FIG. 3 is a side sectional view of a third embodiment of the present invention.

FIGS. 1, 2 and 3 are side sectional views showing the working embodiments of the organic EL element of the present invention.

As shown in FIG. 1, the organic EL element 1 comprises as a base an element base 2 of a rectangle-shaped insulating and transparent glass substrate. In FIG. 1, the anode 5 of ITO film is formed as a transparent conductive material on the element base 2. The ITO film is formed on the element base 2 by, for example, PVD (Physical Vapor Deposition) such as a vacuum deposition method, sputtering method, and the like. Thereafter, a given pattern is applied on the film by etching by means of photoresist method to form the anode 5. A part of the anode 5 is pulled out to the end of the element base 2 and connected to a driving circuit (not shown).

The organic EL layer 4 is stacked on the upper surface of the anode 5 by a PVD method such as molecular beam deposition method, resistive heating method, and the like. The organic EL layer 4 in FIG. 1 comprises three layers of a copper phthalocyanine (CuPc) organic layer 4a as a hole injection layer formed on the anode 5 in film thickness of tens of nanometres, a Bis((N-(1-naphtyl-n-phenyl)) benzidine (α-NPD) organic layer 4b as a hole transportation layer formed on the upper surface of the organic layer 4a in film thickness of tens of nanometres, and a tris(8-quinolinolat)aluminum (Alq$_3$) organic layer 4c as a light-emitting layer and electron transportation layer formed on the upper surface of the organic layer 4b in film thickness of tens of nanometres. The light-emitting part is formed by a laminate comprising the aforementioned anode 5 and organic EL layer 4 and the cathode 6 described later.

The cathode 6 is formed as a metal thin film formed on the upper surface of the organic EL layer 4 (Alq$_3$ organic layer 4c) as shown in FIG. 1. The material for the metal thin film includes a simple metal material of small working function such as Al, Mg, and the like and an alloy of small working function such as Al—Li, Mg—Ag, and the like. The cathode 6 is formed in film thickness of, for example from 10 to 1000 nm, preferably from 50 to 200 nm. A part of the cathode 6 is pulled out to the end of the element base 2 and connected to a driving circuit (not shown).

A rectangle-shaped sealing cap 3 is fixed as a sealing member to the outer periphery of the element base 2 by adhesive 8 such as ultraviolet-curable resin in an atmosphere of an inert gas from which the moisture has been completely removed (for example dry nitrogen) or in a dry atmosphere of dry air. Thereby, the anode 5, organic EL layer 4 and cathode 6 are protected.

The drying film 7 is placed as a drying means on the substrate 2 and/or sealing cap 3 in the container which is hermetically sealed by the substrate 2, sealing cap 3 and adhesive 8. An organometallic compound was used as the drying film.

The reaction of a chelate-type metal complex of the aforementioned organometallic compound containing aluminum with water proceeds by the following reaction formula (4):

As shown in the reaction formula (4), three alkoxy groups are liberated from the aluminum complex and reacted with three hydroxyl groups of the water. It is therefore concluded that the aforementioned compound can be used as a drying agent, chemically removing the moisture.

The reaction of a chelate-type metal complex of metal other than the aforementioned aluminum metal complex with water proceeds by the following reaction formula (5):

As shown in the reaction formula (5), the organic compound corresponding to the valence of the metal is liberated and reacted with n hydroxyl groups. Therefore the compound illustrated by formula (1) can also be used as a drying agent removing chemically the moisture.

In a similar fashion to the above, the present inventors have discovered that the organometallic compound illustrated by the formula (1) adsorbs water molecule by hydrolysis, that is, the moisture in the periphery of the organic EL element reacts with the organometallic compound to separate M—O bond of 2n-member ring, and H and OH of the water molecule are reacted to form hydroxyl (OH) bond. The present inventors have discovered also that since one mole of the organometallic compound illustrated by the formula (1) reacts with three moles of water molecule to form hydroxide, the organometallic compound illustrated by the formula (1) has an adsorbing action on the moisture. And, the present inventors have conceived that the organometallic compound illustrated by the formula (1) has the action and principle upon which the organometallic compound illustrated by the formula (1) can be used as a drying agent for the organic EL element and have discovered that the organometallic compound illustrated by the formula (1) is effective for drying means. Examples of R of the formula (1) are described below but not limited thereto:

R is one selected from the group consisting of an alkyl group, alkenyl group, aryl group, cycloalkyl group, heterocyclic group and acyl group having at least one carbon atom. Alkyl group may be substituted or non-substituted and may be exemplified by a methyl group, ethyl group, propyl group, butyl group, sec-butyl group, pentyl group, hexyl group, heptyl group, octyl group, nonyl group, decyl group, undecyl group, dodecyl group, tridecyl group, tetradecyl group, pentadecyl group, hexadecyl group, heptadecyl group, octadecyl group, nonadecyl group, icosyl group, heneicosyl group, docosyl group, and the like and is preferably those having more than eight carbon atoms. Examples of substituted or non-substituted alkyl group are preferably those described below and an oligomer or polymer thereof may be used. Alkenyl group may be a vinyl group, allyl group, butenyl group, pentenyl group, hexynyl group and the like, and examples of substituted or non-substituted alkenyl group having eight or more carbon atoms may be preferably those described below. The oligomer or polymer thereof may be also used.

Aryl group may be substituted or non-substituted and may be exemplified by a phenyl group, tolyl group, 4-cyanophenyl group, biphenyl group, o,m,p-terphenyl group, naphthyl group, anthranyl group, phenanthrenyl group, fluorenyl group, 9-phenylanthranyl group, 9,10-diphenylanthranyl group, pyrenyl group, and the like and may be preferably those having eight or more carbon atoms. The oligomer or polymer thereof may be used.

Examples of substituted or non-substituted alkoxy group may be a methoxy group, n-butoxy group, tert-butoxy group, trichloromethoxy group, trifluoromethoxy group, and the like and may be preferably those having eight or more carbon atoms. The oligomer or polymer thereof may be used.

Examples of substituted or non-substituted cycloalkyl group may be a cyclopentyl group, cyclohexyl group, norbornane group, adamantane group, 4-methylcyclohexyl group, 4-cyanocyclohexyl group and the like and may be preferably those having eight or more carbon atoms. The oligomer or polymer thereof may be used.

Examples of substituted or non-substituted heterocyclic group may be a pyrrole group, pyrroline group, pyrazole group, pyrazoline group, imidazole group, triazole group, pyridine group, pyridazine group, pyrimidine group, pyrazine group, triazine group, indole group, benzimidazole group, purine group, quinoline group, isoquinoline group, cinorin group, quinoxaline group, benzquinoline group, fluorenone group, dicyanofluorenone group, carbazole group, oxazole group, oxadiazole group, thiazole group, thiadiazole group, benzoxazole group, benzothiazole group, benzotriazole group, bisbenzooxazole group, bisbenzothiazole group, bisbenzoimidazole group and the like. The oligomer or polymer thereof may be used.

Examples of substituted or non-substituted acyl group may be a formyl group, acetyl group, propionyl group, butyryl group, isobutyryl group, valeryl group, isovaleryl group, pivaloyl group, lauroyl group, myristoyl group, palmitoyl group, stearoyl group, oxalyl group, malonyl group, succinyl group, glutaryl group, adipoyl group, pimeloyl group, suberoyl group, azelaoyl group, sebacoyl group, acryloyl group, propioloyl group, methacryloyl group, crotonoyl group, isocrotonoyl group, oleoyl group, elaidoyl group, maleoyl group, fumaroyl group, citraconoyl group, mesaconoyl group, camphoroyl group, benzoyl group, phthaloyl group, isophthaloyl group, telephthaloyl group, naphthoyl group, toluoyl group, hydroatropoyl group, atropoyl group, cinnamoyl group, furoyl group, thenoyl group, nicotynoyl group, isonicotynoyl group, glycoloyl group, lactoyl group, glyceroyl group, tartronoyl group, maloyl group, tartharoyl group, tropoyl group, benziloyl group, salicyloyl group, anisoyl group, vaniloyl group, veratroyl group, piperonyloyl group, orotocatechoyl group, galloyl group, glyoxyloyl group, pyruvoyl group, acetoacetyl group, meso-oxalyl group, meso-oxalo group, oxalacetyl group, oxalaceto group, levulinoyl group, and the like. These acyl groups may be substituted with fluorine, chlorine, bromine, iodine and the like. The number of carbon atoms of the acyl group may be preferably eight and above. The oligomer or polymer thereof may be used.

Examples of the organometallic compound in which R is substituted with one of the above-described substituents and trivalent metal is aluminum are those illustrated by formulae (6), (7) and (8):

Formula 6

Formula 7

Formula 8

Further, the present inventors have discovered that the organometallic compound illustrated by the formula (2) adsorbs water molecule by hydrolysis, that is, the moisture in the periphery of the organic EL element reacts with the organometallic compound to separate M—O bond of 2n-member ring, and H and OH of the water molecule are reacted to form hydroxyl (OH) bond. The present inventors have discovered also that since one mole of the organometallic compound illustrated by the formula (2) reacts with three moles of water molecules to form hydroxide, the organometallic compound illustrated by the formula (2) has an adsorbing action on the moisture. And, the present inventors have conceived that the organometallic compound illustrated by the formula (2) has the action and principle upon which the organometallic compound illustrated by the formula (2) can be used as a drying agent for the organic EL element and have discovered that the organometallic compound illustrated by the formula (2) is effective for drying means. Examples of $R_1$, $R_2$, $R_3$, $R_4$ and $R_5$ of the formula (2) are described below but not limited thereto:

Each of $R_1$, $R_2$, $R_3$, $R_4$ and $R_5$ of the formula (2) are one selected from the group consisting of alkyl group, alkenyl group, aryl group, cycloalkyl group, heterocyclic group and acyl group. Alkyl group may be substituted or non-substituted and may be exemplified by a methyl group, ethyl group, propyl group, butyl group, sec-butyl group, pentyl group, hexyl group, heptyl group, octyl group, nonyl group, decyl group, undecyl group, dodecyl group, tridecyl group, tetradecyl group, pentadecyl group, hexadecyl group, heptadecyl group, octadecyl group, nonadecyl group, icosyl group, heneicosyl group, docosyl group, and the like and is preferably those having eight or more carbon atoms. Examples of substituted or non-substituted alkyl group are preferably those described below and an oligomer or polymer thereof may be used. Alkenyl group may be a vinyl group, allyl group, butenyl group, pentenyl group, hexynyl group, and the like, and examples of substituted or non-substituted alkenyl group having eight or more carbon may be preferably those described below. The oligomer or polymer thereof may be also used.

Aryl group may be substituted or non-substituted and may be exemplified by a phenyl group, tolyl group, 4-cyanophenyl group, biphenyl group, o,m,p-terphenyl group, naphthyl group, anthranyl group, phenanthrenyl group, fluorenyl group, 9-phenylanthranyl group, 9,10-diphenylanthranyl group, pyrenyl group and the like. The oligomer or polymer thereof may be used.

Examples of substituted or non-substituted alkoxy group may be a methoxy group, n-butoxy group, tert-butoxy group, trichloromethoxy group, trifluoromethoxy group and the like. The oligomer or polymer thereof may be used.

Examples of substituted or non-substituted cycloalkyl group may be a cyclopentyl group, cyclohexyl group, norbornane group, adamantane group, 4-methylcyclohexyl group, 4-cyanocyclohexyl group and the like. The oligomer or polymer thereof may be used.

Examples of substituted or non-substituted heterocyclic group may be a pyrrole group, pyrroline group, pyrazole group, pyrazoline group, imidazole group, triazole group, pyridine group, pyridazine group, pyrimidine group, pyrazine group, triazine group, indole group, benzimidazole group, purine group, quinoline group, isoquinoline group, cinorin group, quinoxaline group, benzquinoline group, fluorenone group, dicyanofluorenone group, carbazole group, oxazole group, oxadiazole group, thiazole group, thiadiazole group, benzoxazole group, benzothiazole group, benzotriazole group, bisbenzooxazole group, bisbenzothiazole group, bisbenzoimidazole group and the like. The oligomer or polymer thereof may be used.

Examples of substituted or non-substituted acyl group may be a formyl group, acetyl group, propionyl group, butyryl group, isobutyryl group, valeryl group, isovaleryl group, pivaloyl group, lauroyl group, myristoyl group, palmitoyl group, stearoyl group, oxalyl group, malonyl group, succinyl group, glutaryl group, adipoyl group, pimeloyl group, suberoyl group, azelaoyl group, sebacoyl group, acryloyl group, propioloyl group, methacryloyl group, crotonoyl group, isocrotonoyl group, oleoyl group, elaidoyl group, maleoyl group, fumaroyl group, citraconoyl group, mesaconoyl group, camphoroyl group, benzoyl group, phthaloyl group, isophthaloyl group, telephthaloyl group, naphthoyl group, toluoyl group, hydroatropoyl group, atropoyl group, cinnamoyl group, furoyl group, thenoyl group, nicotynoyl group, isonicotynoyl group, glycoloyl group, lactoyl group, glyceroyl group, tartronoyl group, maloyl group, tartharoyl group, tropoyl group, benziloyl group, salicyloyl group, anisoyl group, vaniloyl group, veratroyl group, piperonyloyl group, orotocatechoyl group, galloyl group, glyoxyloyl group, pyruvoyl group, acetoacetyl group, meso-oxalyl group, meso-oxalo group, oxalacetyl group, oxalaceto group, levulinoyl group and the like. These acyl groups may be substituted with fluorine, chlorine, bromine, iodine and the like. The oligomer or polymer thereof may be used.

Examples of the organometallic compound in which each of $R_1$, $R_2$, $R_3$, $R_4$ and $R_5$ is substituted with one of the above-described substituents and trivalent metal is aluminum are organometallic complex compound illustrated by formulae (9), (10), (11) and (12):

Formula 9

General Formula of Chelope

Formula 10

Aluminium-di-2-ethylhexyloxide-mono-Ethyl aceto acetate Chelope-EH-2

Formula 11

Aluminium-di-2-methylnonyloxide-mono-Ethyl aceto acetate Chelop C10-2

Formula 12

Aluminium-di-2-methynonyloxide-mono-Ethyl aceto acetate Chelope C10-2

An example of the organometallic compound in which the trivalent metal is lanthanum is the organometallic complex compound illustrated by the formula (13):

lanthanum complex

An example of the organometallic compound in which the trivalent metal is yttrium is the organometallic complex compound illustrated by the formula (14):

yttrium complex

An example of the organometallic compound in which the trivalent metal is gallium is the organometallic complex compound illustrated by the formula (15):

gallium complex

Further, the present inventors have discovered that the organometallic compound illustrated by the formula (3) adsorbs water molecule by hydrolysis, that is, the moisture in the periphery of the organic EL element reacts with the organometallic compound to separate M—O bond of 2n-member ring, and H and OH of the water molecule are reacted to form hydroxyl (OH) bond. The present inventors have discovered also that since one mole of the organometallic compound illustrated by the formula (3) reacts with three moles of water molecule to form hydroxide, the organometallic compound illustrated by the formula (3) has an adsorbing action on the moisture. And, the present inventors have conceived that the organometallic compound illustrated by the formula (3) has the action and principle upon which the organometallic compound illustrated by the formula (3) can be used as a drying agent for the organic EL element and have discovered that the organometallic compound illustrated by the formula (3) is effective for drying means. Examples of $R_1$, $R_2$, $R_3$, and $R_4$ of the formula (3) are described below but not limited thereto:

Each of $R_1$, $R_2$, $R_3$ and $R_4$ of the formula (3) are selected from the group consisting of alkyl group, alkenyl group, aryl group, cycloalkyl group, heterocyclic group and acyl group having more than one carbon atom. Alkyl group may be substituted or non-substituted and may be exemplified by a methyl group, ethyl group, propyl group, butyl group, sec-butyl group, pentyl group, hexyl group, heptyl group, octyl group, nonyl group, decyl group, undecyl group, dodecyl group, tridecyl group, tetradecyl group, pentadecyl group, hexadecyl group, heptadecyl group, octadecyl group, nonadecyl group, icosyl group, heneicosyl group, docosyl group, and the like and is preferably those having eight or more carbon atoms. Examples of substituted or non-substituted alkyl group are preferably those described below and an oligomer or polymer thereof may be used. Alkenyl group may be a vinyl group, allyl group, butenyl group, pentenyl group, hexynyl group, and the like, and examples of substituted or non-substituted alkenyl group having eight or more carbon atoms may be preferably those described below. The oligomer or polymer thereof may be also used.

Aryl group may be substituted or non-substituted and may be exemplified by a phenyl group, tolyl group, 4-cyanophenyl group, biphenyl group, o,m,p-terphenyl group, naphthyl group, anthranyl group, phenanthrenyl group, fluorenyl group, 9-phenylanthranyl group, 9,10-diphenylanthranyl group, pyrenyl group and the like. The oligomer or polymer thereof may be used.

Examples of substituted or non-substituted alkoxy group may be a methoxy group, n-butoxy group, tert-butoxy group, trichloromethoxy group, trifluoromethoxy group and the like. The oligomer or polymer thereof may be used.

Examples of substituted or non-substituted cycloalkyl group may be a cyclopentyl group, cyclohexyl group, norbornane group, adamantane group, 4-methylcyclohexyl group, 4-cyanocyclohexyl group and the like. The oligomer or polymer thereof may be used.

Examples of substituted or non-substituted heterocyclic group may be a pyrrole group, pyrroline group, pyrazole group, pyrazoline group, imidazole group, triazole group, pyridine group, pyridazine group, pyrimidine group, pyrazine group, triazine group, indole group, benzimidazole group, purine group, quinoline group, isoquinoline group, cinorin group, quinoxaline group, benzquinoline group, fluorenone group, dicyanofluorenone group, carbazole group, oxazole group, oxadiazole group, thiazole group, thiadiazole group, benzoxazole group, benzothiazole group, benzotriazole group, bisbenzooxazole group, bisbenzothiazole group, bisbenzoimidazole group. The oligomer or polymer thereof may be used.

Examples of substituted or non-substituted acyl group may be a formyl group, acetyl group, propionyl group, butyryl group, isobutyryl group, valeryl group, isovaleryl group, pivaloyl group, lauroyl group, myristoyl group, palmitoyl group, stearoyl group, oxalyl group, malonyl group, succinyl group, glutaryl group, adipoyl group, pimeloyl group, suberoyl group, azelaoyl group, sebacoyl group, acryloyl group, propioloyl group, methacryloyl group, crotonoyl group, isocrotonoyl group, oleoyl group, elaidoyl group, maleoyl group, fumaroyl group, citraconoyl group, mesaconoyl group, camphoroyl group, benzoyl group, phthaloyl group, isophthaloyl group, telephthaloyl group, naphthoyl group, toluoyl group, hydroatropoyl group, atropoyl group, cinnamoyl group, furoyl group, thenoyl group, nicotynoyl group, isonicotynoyl group, glycoloyl group, lactoyl group, glyceroyl group, tartronoyl group, maloyl group, tartharoyl group, tropoyl group, benziloyl group, salicyloyl group, anisoyl group, vaniloyl group, veratroyl group, piperonyloyl group, orotocatechoyl group, galloyl group, glyoxyloyl group, pyruvoyl group, acetoacetyl group, meso-oxalyl group, meso-oxalo group, oxalacetyl group, oxalaceto group, levulinoyl group, and the like. These acyl groups may be substituted with fluorine, chlorine, bromine, iodine and the like. The oligomer or polymer thereof may be used.

An example of the organometallic compound in which each of $R_1$, $R_2$, $R_3$ and $R_4$ is substituted with one of the above-described substituents and tetravalent metal is germanium is the organometallic complex compound illustrated by formula (16):

germanium complex

An example of the organometallic compound in which R is substituted with the above-described substituents and tetravalent metal is silicon is the organometallic complex compound illustrated by formula (17):

silicon complex

It may be inferred that the compounds illustrated by the formulae (1), (2) and (3) have action and principle upon which conventionally used drying agent such as physical drying agent, chemical organic solvent and the like is dispersed and adheres to the compounds illustrated by the formulae (1), (2) and (3) because they dissolves in aromatic organic solvent such as toluene, xylene and the like or aliphatic organic solvent. The drying agent film 7 is formed as drying means on the inner surface of the sealing cap 2. As the drying agent film 7 may be considered several types of structures as described below. First, the drying agent film 7 can be composed of only an organometallic compound illustrated by the formulae (1), (2) or (3) and other organometallic compounds. Since the drying agent film 7 made of the organometallic compound illustrated by the formulae (1), (2) or (3) and other organometallic compounds is obtained as solution of aromatic organic solvent such as toluene, xylene and the like or aliphatic organic solvent in which is dissolved the organometallic compound containing n-valent metal, the above-described solution is applied to the inner surface of the substrate 3 by, for example printing method, spin-coat method, coating method, and the like and dried to form the film.

Further, the drying agent film 7 can be formed by adding an inorganic drying agent into the drying agent film of the organometallic compound illustrated by the formulae (1), (2) or (3) and other organometallic compounds. As the drying agent to be added into the drying agent film may be a drying agent adsorbing chemically the water molecule (chemical adsorption) or adsorbing physically the water molecule (physical adsorption) or any other drying agents.

For the drying agent adsorbing chemically the water molecule (chemical adsorption), its drying efficiency can be improved moreover by using a dispersing one selected from the group consisting of metallic oxide, sulfate, metal halide, perchlorate and metal in the solution of aromatic organic solvent such as toluene, xylene and the like or aliphatic organic solvent in which is dissolved the organometallic compound illustrated by the formulae (1), (2) or (3) and other organometallic compounds.

An alkaline metal oxide may be exemplified by sodium oxide ($Na_2O$) and potassium oxide ($K_2O$). An alkaline earth metal oxide may be exemplified by calcium oxide (CaO), barium oxide (BaO) and magnesium oxide (MgO). The aforementioned sulfate may be lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2SO_4$), titanium sulfate ($Ti(SO_4)_2$), nickel sulfate ($NiSO_4$) and the like. For these salts may be preferably used anhydrides.

The aforementioned halides may be calcium chloride ($CaCl_2$), magnesium chloride ($MgCl_2$), strontium chloride ($SrCl_2$), yttrium chloride ($YCl_2$), copper chloride (CuCl2), cesium fluoride (CsF), tantalum fluoride ($TaF_5$), niobium fluoride ($NbF_5$), calcium bromide ($CaBr_2$), cerium bromide ($CeBr_2$), selenium bromide ($SeBr_4$), vanadium bromide ($VBr_2$), magnesium bromide ($MgBr_2$), barium iodide ($BaI_2$), magnesium iodide ($MgI_2$) and the like. For these metal halides may be preferably used anhydrides.

The aforementioned perchlorate may be barium calcium perchlorate ($Ba(ClO_4)_2$) and magnesium perchlorate ($Mg(ClO_4)_2$). For these perchlorates may be preferably used anhydrides. The drying efficiency of the drying agent for adsorbing physically the water molecule (physical adsorption) can be improved moreover by using by dispersing one selected from the group consisting of zeolite, silica gel, activated alumina, titanium oxide, carbon, carbon nanotube and fullerrene in the solution of aromatic organic solvent such as toluene, xylene and the like or aliphatic organic solvent in which is dissolved the organometallic compound illustrated by the formulae (1), (2) or (3) and other organometallic compounds.

After films of the anode, the organic EL layer and the cathode are formed on the substrate 2 by physical deposition method, CuPc, and the like as a buffer layer and GeO as a protecting layer are physically deposited, on which can be provided the drying agent layer comprising the organometallic compound illustrated by the formulae (1), (2) and (3) and other organometallic compounds to form a moisture impermeable layer. By dispersing such drying agent as the aforementioned chemical drying agent or physical drying agent into the aforementioned drying agent layer of the present invention, its drying effect can be moreover improved.

Similar effect can be obtained in a polymer-type organic EL element comprising films of polyvinyl carbazole (PVK) and the like instead of the aforementioned organic layers (4a, 4b, 4c).

Similar effect can be obtained in an organic functional element using a functional organic compound such as an organic solar cell and the like instead of the aforementioned organic layers (4a, 4b, 4c).

The present invention is described in greater detail herein in the following examples, which are illustrated and are not to be taken as limiting of the present invention.

EXAMPLE 1

As shown in FIG. 1, an organic EL element 1 comprises as a base an element base 2 of a rectangle-shaped insulating and transparent glass substrate. In FIG. 1, the anode 5 of ITO film 200 nm in thickness was formed as a transparent conductive material on the element base 2 by sputtering method. Thereafter, patterning was carried out in a given pattern by etching by means of photoresist method to form the anode 5. A part of the anode 5 as an electrode is pulled out to the end of the element base 2 and connected to a driving circuit (not shown).

On the upper surface of the anode 5 were formed the copper phthalocyanine (CuPc) organic layer 4a as a hole injection layer formed in film thickness of 70 nm by means of resistive heating method, the Bis((N-(1-naphthyl-n-phenyl)) benzidine (α-NPD) organic layer 4b as a hole transportation layer formed on the upper surface of the organic layer 4a in film thickness of 30 nm, and the tris (8-quinolinolat) aluminum ($Alq_3$) organic layer 4c as a light-emitting layer and electron transportation layer formed on the upper surface of the organic layer 4b in film thickness of 50 nm. Then, a film of Al—Li 200 nm in thickness was formed as the cathode 6 by co-deposition method. A part of the cathode 6 is pulled out to the end of the element base 2 and connected to a driving circuit (not shown).

Such procedures for producing the organic EL element as described above are used in subsequent examples.

The outer periphery of the element substrate 2 was coated with only a solution containing 48 weight % aluminum oxide octylate (trade name "OLIVE" manufactured by HOPE PHARMACEUTICAL CO., LTD.) illustrated by the formula (6) in a dry atmosphere by dry air from which was removed the moisture to the utmost, and dried.

Next, the sealing cap 3 was coated with only a solution containing 48 weight % aluminum oxide octylate (trade name "OLIVE" manufactured by HOPE PHARMACEUTICAL CO., LTD.) (formula 6), one of the organometalic compound illustrated by the formula (1) in a dry atmosphere by dry air from which was moisture was completely removed. In such a manner as described above, a transparent film of organometallic compound 100 μm in thickness was formed for drying means. While the organometallic compound as the drying means is applied to the whole area of the plate member 3 constituting the sealing cap as shown in FIG. 1, it may be applied to the plate member 3 except the area of ultraviolet-curable epoxy resin of the sealing part.

In a dry atmosphere of dry air from which moisture was removed completely, the organometallic EL element substrate and the sealing cap were placed oppositely each other and coated with the ultraviolet-curable epoxy resin and dried to seal. Then, heating at 100° C. for one hour was carried out to proceed reaction with the moisture after sealing.

Figure 5:
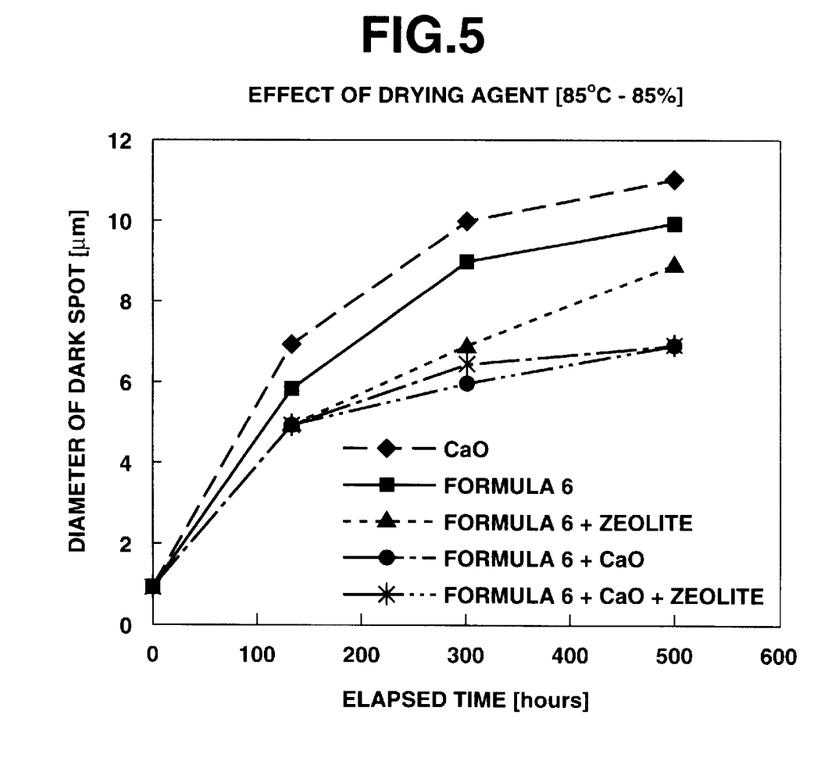
FIG. 5 is a graph showing the growth of the dark spot of the present invention.

After an accelerated life test was carried out for the light-emitting part of the organometallic EL element in a test chamber maintained at a temperature of 85° C. and humidity of 85%, the growth of dark spot was observed under a microscope. As a result, it was confirmed that while the diameter of the dark spot at initial stage was 1 μm, it grew up to be only 10 μm at central portion after an elapse of 500 hours. A dark spot of not more than 10 μm can not be confirmed visually and has no problem for practical applications. Similarly, the generation and growth of the dark spot at peripheral portion were inhibited effectively. It may be considered that the accelerated life test in which was applied 500 hours corresponds to several hundred hours of a usual life test (FIG. 5).

EXAMPLE 2

The method for producing the organic EL element is the same as that used in Example 1. With reference to FIG. 2 showing an example in which a recess from 0.2 to 0.25 mm in depth is formed in the sealing cap of FIG. 1. The organic EL element 21 of example 2 is described below.

The sealing cap 23 providing with the recess of from 0.2 to 0.25 mm in depth was coated with only a solution containing 48 weight % aluminum oxide octylate (trade name "OLIVE" manufactured by HOPE PHARMACEUTICAL CO., LTD.) (formula 4), one of the organometalic compound illustrated by the formula (1) in a dry atmosphere and dried on a hot plate at 100~120° C. to volatalize the solvent, and the organometallic compound was fixed to the sealing cap 23. Except for this process, the same process as that of Example 1 was employed. After sealing, heating at 100° C. for one hour was carried out to proceed reaction with the moisture.

After an accelerated life test was carried out for the light-emitting part of the organometallic EL element in a test chamber maintained at a temperature of 85° C. and humidity of 85%, the growth of the dark spot was observed under a microscope. As a result, it was confirmed that while the diameter of the dark spot at initial stage was 1 μm, it grew up to be only 10 μm at central portion after an elapse of 500 hours. The generation and growth of the dark spot at peripheral portion were not different from those at the central portion (FIG. 5).

EXAMPLE 3

Example 3 made use of the drying agent used in Example 2 in combination with a chemical drying agent (FIG. 2) (Example in which the recess from 0.2 to 0.25 mm in depth was formed in the sealing cap shown in FIG. 1).

The procedures used in Example 1 were repeated except that the recess 29 was coated with fluid dispersion obtained by dispersing calcium oxide (CaO), chemical drying agent, in a solution containing 48 weight % aluminum oxide octylate (trade name "OLIVE" manufactured by HOPE PHARMACEUTICAL CO., LTD.) (formula 6), one of the organometallic compound illustrated by the formula (2) in the weight ratio of 1:1 in a dry atmosphere.

After an accelerated life test was carried out for the light-emitting part of the organometallic EL element in a test chamber maintained at a temperature of 85° C. and humidity of 85%, the growth of the dark spot was observed under a microscope. As a result, it was confirmed that while the diameter of the dark spot at initial stage was 1 μm, it grew up to be only 7 μm at central portion after an elapse of 500 hours. The generation and growth of the dark spot at peripheral portion were not different from those at the central portion (FIG. 5).

EXAMPLE 4

Example 4 made use of the drying agent used in Example 2 in combination with a physical drying agent.

The procedures used in Example 1 were repeated except that the recess 29 was coated with fluid dispersion obtained by dispersing physical drying agent zeolite in a solution containing 48 weight % aluminum oxide octylate (trade name "OLIVE" manufactured by HOPE PHARMACEUTICAL CO., LTD.) (formula 6), one of the organometallic compound illustrated by the formula (1) in weight ratio of 1:1 in a dry atmosphere.

After an accelerated life test was carried out for the light-emitting part of the organometallic EL element in a test chamber maintained at a temperature of 85° C. and humidity of 85%, the growth of the dark spot was observed under a microscope. As a result, it was confirmed that while the diameter of the dark spot at initial stage was 1 μm, it grew up to be only 9 μm at central portion after an elapse of 500 hours. The generation and growth of the dark spot at peripheral portion were not different from those at the central portion (FIG. 5).

EXAMPLE 5

Example 5 made use of the drying agent used in Example 2 in combination with a chemical drying agent and a physical drying agent.

The procedures used in Example 1 were repeated except that the recess 29 was coated with fluid dispersion obtained by dispersing chemical drying agent calcium oxide (CaO) (referred to as "X") and physical drying agent zeolite (referred to as "Y") in a solution containing 48 weight % aluminum oxide octylate (trade name "OLIVE" manufactured by HOPE PHARMACEUTICAL CO., LTD.)(formula 6) (referred to as "Z"), one of the organometallic compound illustrated by the formula (1) with the weight ratio of X:Y:Z in 1:1:2 in a dry atmosphere.

After an accelerated life test was carried out for the light-emitting part of the organometallic EL element in a test chamber maintained at a temperature of 85° C. and humidity of 85%, the growth of the dark spot was observed under a microscope. As a result, it was confirmed that while the diameter of the dark spot at initial stage was 1 μm, it grew up to be only 7 μm at central portion after an elapse of 500 hours. The generation and growth of the dark spot at peripheral portion were not different from those at the central portion (FIG. 5).

EXAMPLE 6

The organic EL element in which the electrodes and the organic EL layer are protected with a protecting film (FIG. 3).

On the substrate 32 ware physically deposited ITO 150 nm in thick as the anode 35, CuPc 20 nm in thick as the hole injection layer 34a, Alq$_3$ 50 nm in thick as the electron transporting light-emitting layer 34c, lithium fluoride 0.5 nm in thick as the electron injection layer 34d, aluminum 200 nm in thick as the cathode 36, CuPc 500 nm in thick as the buffer layer 38, and GeO 1000 nm in thick as the protecting layer 39 to obtain a laminate.

The laminate thus obtained was dipped in only a solution containing 48 weight % aluminum oxide octylate (trade name "OLIVE" manufactured by HOPE PHARMACEUTICAL CO., LTD.) included in the formula (6) in a dry atmosphere and dried to form the drying means 37 coated with a film 10 μm in thick, which was then coated with the non-permeable layer 33 (for example, epoxy resin) 20 μm in thick by printing method.

After an accelerated life test was carried out for the light-emitting part of the organometallic EL element thus obtained in a test chamber maintained at a temperature of 85° C. and humidity of 85%, the growth of the dark spot was observed under a microscope. As a result, it was confirmed that while the diameter of the dark spot at initial stage was 1 μm, it grew up to be only 10 μm at central portion after an elapse of 500 hours. The generation and growth of the dark spot at peripheral portion were not different from those at the central portion (FIG. 5).

EXAMPLE 7

Example 7 made use of the drying agent used in Example 6 in combination with a chemical drying agent.

The procedures used in Example 6 were repeated except that calcium oxide (CaO), a chemical drying agent, was dispersed in a solution containing 48 weight % aluminum oxide octylate (trade name "OLIVE" manufactured by HOPE PHARMACEUTICAL CO., LTD.) (formula 6), one of the organometallic compound illustrated by the formula (1) in weight ratio of 1:1 in a dry atmosphere.

After an accelerated life test was carried out for the light-emitting part of the organometallic EL element thus obtained in a test chamber maintained at a temperature of 85° C. and humidity of 85%, the growth of the dark spot was observed unde a microscope. As a result, it was confirmed that while the diameter of the dark spot at initial stage was 1 μm, it grew up to be only 7 μm at central portion after an elapse of 500 hours. The generation and growth of the dark spot at peripheral portion were not different from those at the central portion (FIG. 5).

EXAMPLE 8

Example 8 made use of the drying agent used in Example 6 in combination with a physical drying agent.

The procedures used in Example 6 were repeated except that the zeolite, physical drying agent, was dispersed in a solution containing 48 weight % aluminum oxide octylate (trade name "OLIVE" manufactured by HOPE PHARMACEUTICAL CO., LTD.) (formula 6), one of the organometallic compound illustrated by the formula (1) in weight ratio of 1:1 in a dry atmosphere.

After an accelerated life test was carried out for the light-emitting part of the organometallic EL element thus obtained in a test chamber maintained at a temperature of 85° C. and humidity of 85%, the growth of the dark spot was observed under a microscope. As a result, it was confirmed that while the diameter of the dark spot at initial stage was 1 μm, it grew up to be only 9 μm at central portion after an elapse of 500 hours. The generation and growth of the dark spot at peripheral portion were not different from those at the central portion (FIG. 5).

EXAMPLE 9

Example 9 made use of the drying agent used in Example 6 in combination with a physical drying agent and a chemical drying agent.

The procedures used in Example 6 were repeated except that the zeolite (referred to as "X"), physical drying agent, and calcium oxide (CaO) (referred to as "Y"), chemical drying agent, were dispersed in a solution containing 48 weight % aluminum oxide octylate (trade name "OLIVE" manufactured by HOPE PHARMACEUTICAL CO., LTD.) (formula 4) (referred to as "Z"), one of the organometallic compound illustrated by the formula (1) with the weight ratio of X:Y:Z in 1:1:2 in a dry atmosphere.

After an accelerated life test was carried out for the light-emitting part of the organometallic EL element thus obtained in a test chamber maintained at a temperature of 85° C. and humidity of 85%, the growth of the dark spot was observed under a microscope. As a result, it was confirmed that while the diameter of the dark spot at initial stage was 1 μm, it grew up to be only 7 μm at a central portion after an elapse of 500 hours. The generation and growth of the dark spot at a peripheral portion were not different from those at the central portion (FIG. 5).

Comparison Example 1

On a substrate were physically deposited ITO 150 nm in thick as an anode, CuPc 20 nm in thick as a hole injection layer, α-NPD 30 nm in thick as a hole-transporting layer, $Alq_3$ 50 nm in thick as an electron transporting light-emitting layer, lithium fluoride 0.5 nm in thick as an electron injection layer, and aluminum 200 nm in thick as a cathode to obtain an organic EL laminate.

The organic EL laminate thus obtained and an sealing cap having a recess containing CaO as drying means were placed oppositely each other and sealed with ultraviolet-curable epoxy resin.

After an accelerated life test was carried out for the light-emitting part of the organic EL element thus obtained in a test chamber maintained at a temperature of 85° C. and humidity of 85%, the growth of the dark spot was observed under a microscope. As a result, it was confirmed that while the diameter of the dark spot at initial stage was 1 μm, it grew up to be only 11 μm at the central portion after an elapse of 500 hours. The amount of the dark spot generated at peripheral portion of the organic EL element was larger than that at the central portion (FIG. 5).

EXAMPLE 10

An inner surface of a sealing glass was coated with 50 weight % of toluene solution of Aluminium-di-2-ethylhexyloxide-mono-ethyl acetoacetate (trade name "Chelope-EH-2" manufactured by HOPE PHARMACEUTICAL CO., LTD.) illustrated by formula (10) and dried to obtain a substrate. An organic EL element was sealed with the substrate thus obtained by making use of adhesive.

Figure 6:
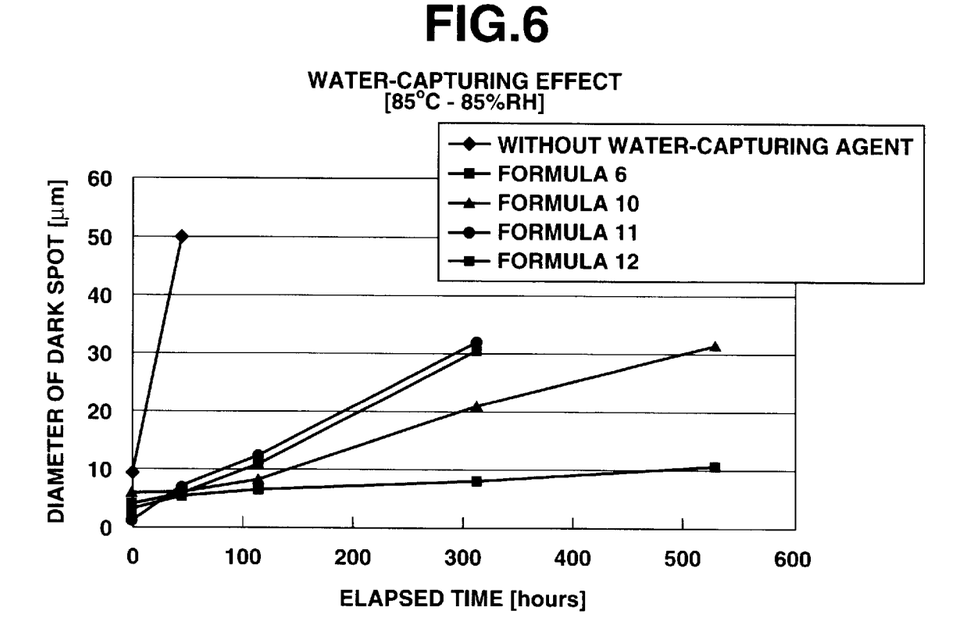
FIG. 6 is a graph showing the growth of the dark spot of the present invention.

Thereafter, the organic EL element was heated to 100° C. in an oven to adsorb the water in the element. The state of emission of this organic EL element was observed unde a microscope. After an accelerated life test was carried out in a test chamber maintained at a temperature of 85° C. and humidity of 85%, the growth of the dark spot was observed. After an elapse of 100 hours, the element was taken out of the chamber and the state of emission of this organic EL element was observed under a microscope. As a result, non-light emitting portion (dark spot) was hardly observed at a central portion and the generation and growth of the dark spot at a peripheral portion were not different from those at the central portion (FIG. 6).

EXAMPLE 11

An organic EL element was produced by making use of the same procedures as that of example 10 except that Aluminium-di-2-ethylhylnonyloxide-mono-ethyl acetoacetate (trade name "Chelope C10-2)" manufactured by HOPE PHARMACEUTICAL CO., LTD.) illustrated by formula (11) was used. Another procedures used were the same as those of example 1. The state of emission of the organic EL element thus obtained was observed under a microscope. After an accelerated life test was carried out in a test chamber maintained at a temperature of 85° C. and humidity of 85%, the growth of the dark spot was observed. After elapse of 100 hours, the element was taken out of the chamber and the state of emission of this organic EL element was observed under a microscope. As a result, non-light emitting portion (dark spot) was hardly observed at the central portion and the generation and growth of the dark spot at the peripheral portion were not different from those at the central portion (FIG. 6).

EXAMPLE 12

An organic EL element was produced by making use of the same procedures as that of example 10 except that Aluminium-di-n-lauriloxide-mono-ethyl acetoacetate (trade name "Chelope C11-2)" manufactured by HOPE PHARMACEUTICAL CO., LTD.) illustrated by formula (12) was used. Another procedures used were the same as those of example 1. The state of emission of the organic EL element thus obtained was observed under a microscope. After an accelerated life test was carried out in a test chamber maintained at a temperature of 85° C. and humidity of 85%, the growth of the dark spot was observed. After an elapse of 100 hours, the element was taken out of the chamber and the state of emission of this organic EL element was observed under a microscope. As a result, non-light emitting portion (dark spot) was hardly observed at a central portion and the generation and growth of the dark spot at a peripheral portion were not different from those at the central portion (FIG. 6).

Comparison Example 2

An organic EL element was produced by making use of the same procedures as those of example 10 except that sealing was carried out without using water-capturing agent. Another procedures used were the same as those of Example 1. The state of emission of the organic EL element thus obtained was observed under a microscope. After an accelerated life test was carried out in a test chamber maintained at a temperature of 85° C. and humidity of 85%, the growth of the dark spot was confirmed. After an elapse of 100 hours, the element was taken out of the chamber and the state of emission of this organic EL element was observed under a microscope. As a result, non-light emitting portion (dark spot) was observed and ratio of emission area fell to 60%. After an elapse of 200 hours, emission was not observed at all.

Next, an experiment was carried out by changing a central metal of organometallic complex, a series "Chelope" manufactured by HOPE PHARMACEUTICAL CO., LTD.

EXAMPLE 13

An inner surface of a sealing glass for a substrate was coated with a solution of La complex illustrated by formula (13) as drying agent and dried. An organic EL element was sealed with the substrate by using adhesive. Other procedures used were the same as those used in Example 1. The organic EL element was heated to 100° C. to adsorb the water in the element. The state of emission of the organic EL element thus obtained was observed under a microscope. After an accelerated life test was carried out in a test chamber maintained at a temperature of 85° C. and humidity of 85%, the growth of the dark spot was confirmed. After an elapse of 100 hours, the element was taken out of the chamber and the state of emission of this organic EL element was observed under a microscope. As a result, non-light emitting portion (dark spot) was hardly observed. And the generation and growth of the dark spot at a peripheral portion were not different from those at the central portion. Area of non-light emitting portion was small compared with that of an element without water-capturing agent (FIG. 6).

Results obtained by Examples 14~17 and Comparison Example 3 are shown in FIG. 6.

EXAMPLE 14

Figure 7:
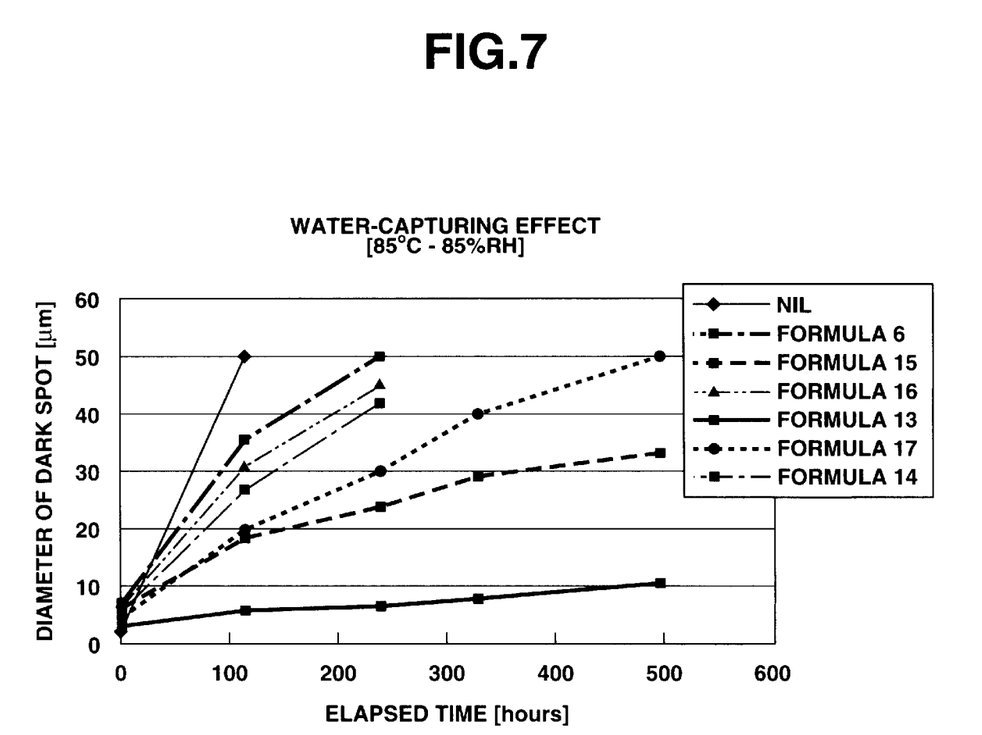
FIG. 7 is a graph showing the growth of the dark spot of the present invention.

An organometallic complex having silicon as a central metal, one of a series "Chelope" manufactured by HOPE PHARMACEUTICAL CO., LTD. illustrated by formula (17) was synthesized as a water-capturing agent as drying means. The same procedures as those used in Example 1 were repeated except that the organometallic complex illustrated by formula (17) was previously dissolved in toluene. An inner surface of a sealing glass for a substrate was coated with a solution of Si complex and dried. An organic EL element was sealed with the substrate by using adhesive. Then, the organic EL element was heated to 100° C. in an oven to adsorb the water in the element. The state of emission of the organic EL element thus obtained was observed under a microscope. After an accelerated life test was carried out in a test chamber maintained at a temperature of 85° C. and humidity of 85%, the growth of the dark spot was confirmed. After an elapse of 100 hours, the element was taken out of the chamber and the state of emission of this organic EL element was observed under a microscope. As a result, non-light emitting portion (dark spot) was hardly observed (FIG. 7). While the Si complex was inferior to the La complex in an effect for water-capturing agent, area of non-light emitting portion was smaller than that of an element without water-capturing agent. The generation and growth of the dark spot at a peripheral portion were not different from those at a central portion.

EXAMPLE 15

An organometallic complex having yttrium as a central metal, one of a series "Chelope" manufactured by HOPE PHARMACEUTICAL CO., LTD. illustrated by formula (14) was synthesized as a water-capturing agent as drying means. Another procedures were the same as those used in example 1. Then, vacuum of a camber was released and sealing was carried out in day nitrogen. An inner surface of a sealing glass for a substrate was coated with a solution of Y complex and dried. An organic EL element was sealed with the substrate by using adhesive. Thereafter, the organic EL element was heated to 100° C. in an oven to adsorb the water in the element. The state of emission of the organic EL element thus obtained was observed under a microscope. After an accelerated life test carried out in a test chamber maintained at a temperature of 85° C. and humidity of 85%, the growth of the dark spot was confirmed. After an elapse of 100 hours, the element was taken out of the chamber and the state of emission of this organic EL element was observed under a microscope. As a result, non-light emitting portion (dark spot) was hardly observed at a central portion. While the Y complex was inferior to the La complex in an effect for water-capturing agent, area of non-light emitting portion was smaller than that of an element without water-capturing agent. The generation and growth of the dark spot at a peripheral portion were not different from those at the central portion (FIG. 7).

EXAMPLE 16

An organometallic complex having germanium as a central metal, one of a series "Chelope" manufactured by HOPE PHARMACEUTICAL CO., LTD. illustrated by formula (16) was synthesized as a water-capturing agent as drying means. Another procedures were the same as those used in Example 1. Then, vacuum of a camber was released and sealing was carried out in day nitrogen. An inner surface of a sealing glass for a substrate was coated with a solution of Ge complex and dried. An organic EL element was sealed with the substrate by using adhesive. Thereafter, the organic EL element was heated to 100° C. in an oven to adsorb the water in the element. The state of emission of the organic EL element thus obtained was observed under a microscope. After an accelerated life test carried out in a test chamber maintained at a temperature of 85° C. and humidity of 85%, the growth of the dark spot was confirmed. After an elapse of 100 hours, the element was taken out of the chamber and the state of emission of this organic EL element was observed under a microscope. As a result, the growth of non-light emitting portion (dark spot) was hardly observed at a central portion. The generation and growth of the dark spot at a peripheral portion were not different from those at the central portion. While the Ge complex was inferior to the La complex in an effect for water-capturing agent, area of non-light emitting portion was smaller than that of an element without water-capturing agent (FIG. 7).

EXAMPLE 17

An organometallic complex having gallium as a central metal, one of a series "Chelope" manufactured by HOPE PHARMACEUTICAL CO., LTD. illustrated by formula (15) was synthesized as a water-capturing agent as drying means. An inner surface of a sealing glass for a substrate was coated with a solution of Ge complex and dried. An organic EL element was sealed with the substrate by using adhesive. Another procedures were the same as those used in Example 1. Then, the organic EL element was heated to 100° C. in an oven to adsorb the water in the element. The state of emission of the organic EL element thus obtained was observed under a microscope. After an accelerated life test carried out in a test chamber maintained at a temperature of 85° C. and humidity of 85%, the growth of the dark spot was confirmed. After an elapse of 100 hours, the element was taken out of the chamber and the state of emission of this organic EL element was observed under a microscope. As a result, the growth of non-light emitting portion (dark spot) was hardly observed at a central portion. The generation and growth of the dark spot at a peripheral portion were not different from those at the central portion. While the Ga complex was inferior to the La complex in an effect for water-capturing agent, area of non-light emitting portion was smaller than that of an element without water-capturing agent (FIG. 7).

Comparison Example 3

As a comparison Example, sealing was carried out without using water-capturing agent. Another procedures used were the same as those of Example 1 was prepared by making use of the same procedures as those of Example 1 except that sealing was the state of emission of the organic EL element prepared by Comparative Example 3 was observed under a microscope. A confirmation test for water-capturing effect was conducted in a test chamber maintained at a temperature of 85° C. and humidity of 85%. After an elapse of 100 hours, the element was taken out of the chamber and the state of emission of this organic EL element was observed under a microscope. As a result, non-light emitting portion (dark spot) was observed and ratio of emission area fell to 60%. After an elapse of 200 hours, emission was not observed at all.

The results obtained in Examples 14~17 and Comparison Example 3 are shown in graph below (FIG. 7).

As described above in detail, the following effects were obtained by the present invention:

(1) A novel material was discovered for preventing generation and growth of a dark spot in an organic EL element.
(2) Since the drying means of the present invention is liquid when mounting to be formed easily in the form of film, it is easy to handle and has extremely great effect in industry.
(3) Since the drying means of the present invention can be used in combination with other chemical drying agents to enhance the effect, it has extremely great effect in industry.

(4) Since the drying means of the present invention can be used in combination with other physical drying agents to enhance the effect, it has extremely great effect in industry.

(5) Since the drying means of the present invention can prevent generation and growth of a dark spot on the peripheral portion of an organic El element because it can be placed freely on the periphery of the organic El element, it has extremely great effect in industry.

What is claimed is:

1. An organic EL element comprising:

a sealed container;

a light emitting region formed in said container, said light emitting region being formed of organic EL medium layers sandwiched between a pair of opposed anode and cathode electrodes; and a drying medium layer comprising an organometallic compound, said drying medium layer being provided in said container spaced apart from said light emitting region, wherein the organometallic compound is represented by one of the following formulae (1)–(6):

(1)

wherein R is selected from the group consisting of alkyl group, alkenyl group, aryl group, cycloalkyl group, heterocyclic group and acyl group having at least one carbon atom, M is a trivalent metal atom, and n is an integer of more than one;

(2)

(3)

(4)

(5)

wherein each of $R_1$, $R_2$, $R_3$, $R_4$ and $R_5$ is selected from the group consisting of alkyl group, alkenyl group, aryl group, cycloalkyl group, heterocyclic group and acyl group having at least one carbon atom, and M is a trivalent metal atom; and (6)

wherein each of $R_1$, $R_2$, $R_3$ and $R_4$ is selected from the group consisting of alkyl group, alkenyl group, aryl group, cycloalkyl group, heterocyclic group and acyl group having at least one carbon atom, and M is a tetravalent metal.

2. The organic EL element as defined in claim 1, wherein said drying medium layer is provided on an inner surface of said container.

3. The organic EL element as defined in claim 1, wherein said drying medium layer is provided to cover said light emitting region.

4. The organic EL element as defined in claim 1, wherein the organometallic compound is represented by the following formula wherein R is selected from the group consisting of alkyl group, alkenyl group, aryl group, cycloalkyl group, heterocyclic group and acyl group having at least one carbon atom, M is a trivalent metal atom, and n is an integer of more than one.

5. The organic EL element as defined in claim 1, wherein the organometallic compound is represented by the following formula

6. The organic EL element as defined in claim 1, wherein the organometallic compound is represented by the following formula 7. The organic EL element as defined in claim 1, wherein the organometallic compound is represented by the following formula 8. The organic EL element as defined in claim 1, wherein the organometallic compound is represented by the following formula wherein each of $R_1$, $R_2$, $R_3$, $R_4$ and $R_5$ is selected from the group consisting of alkyl group, alkenyl group, aryl group, cycloalkyl group, heterocyclic group and acyl group having at least one carbon atom, and M is a trivalent metal atom.

9. The organic EL element as defined in claim 1, wherein the organometallic compound is represented by the following formula wherein each of $R_1$, $R_2$, $R_3$ and $R_4$ is selected from the group consisting of alkyl group, alkenyl group, aryl group, cycloalkyl group, heterocyclic group and acyl group having at least one carbon atom, and M is a tetravalent metal.

* * * * *

UNITED STATES PATENT AND TRADEMARK OFFICE
CERTIFICATE OF CORRECTION

PATENT NO. : 6,656,609 B2
DATED : December 2, 2003
INVENTOR(S) : Takahashi et al.

It is certified that error appears in the above-identified patent and that said Letters Patent is hereby corrected as shown below:

<u>Title page,</u>
Item [30], Foreign Application Priority Data, should read:
-- [30]       Foreign Application Priority Data
      May 8, 2000      (JP) ....................... 2000-134747
      Mar. 30, 2001    (JP) .......................2001-101437 --

Signed and Sealed this

Seventeenth Day of February, 2004

JON W. DUDAS
*Acting Director of the United States Patent and Trademark Office*